United States Patent
Buynoski

(10) Patent No.: US 6,452,250 B1
(45) Date of Patent: Sep. 17, 2002

(54) STACKED INTEGRATED CIRCUIT AND CAPACITOR STRUCTURE CONTAINING VIA STRUCTURES

(75) Inventor: Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/488,289

(22) Filed: Jan. 20, 2000

(51) Int. Cl.[7] .............................................. H01L 29/00
(52) U.S. Cl. ...................... 257/532; 257/698; 257/700; 257/724; 257/758; 257/774; 361/306.3; 361/307; 361/308.1; 361/321.2
(58) Field of Search ................................ 257/303, 306, 257/516, 532, 535, 698, 700, 924, 737, 738, 758, 774, 778, 724; 361/306.2, 306.3, 734, 307, 308.1, 321.2, 321.6; 438/107, 613, 622

(56) References Cited

U.S. PATENT DOCUMENTS

| | | | | |
|---|---|---|---|---|
| 5,144,526 A | * | 9/1992 | Vu et al. ..................... | 361/321 |
| 5,472,900 A | | 12/1995 | Vu et al. ..................... | 438/396 |
| 5,770,875 A | | 6/1998 | Assaderaghi et al. ....... | 257/301 |
| 5,811,868 A | | 9/1998 | Bertin et al. ................ | 257/516 |
| 5,841,182 A | | 11/1998 | Linn et al. .................. | 257/532 |
| 5,920,102 A | | 7/1999 | Davies et al. ............... | 257/401 |
| 5,950,292 A | | 9/1999 | Dimos et al. ............... | 29/25.42 |
| 5,965,917 A | | 10/1999 | Maszara et al. ............ | 257/347 |
| 6,080,620 A | | 6/2000 | Jeng .......................... | 438/253 |
| 6,096,584 A | | 8/2000 | Ellis-Monaghan et al. .. | 438/151 |
| 6,188,122 B1 | | 2/2001 | Davari et al. ............... | 257/532 |
| 6,232,154 B1 | | 5/2001 | Reith et al. ................. | 438/129 |
| 6,271,074 B1 | | 8/2001 | Hain et al. .................. | 438/239 |
| 6,184,567 B1 | * | 2/2002 | Fujisawa et al. ............ | 257/532 |

FOREIGN PATENT DOCUMENTS

JP          410092966 A        4/1998

OTHER PUBLICATIONS

Claims from Serial No. 09/510,833, filed Feb. 23, 2000.

* cited by examiner

Primary Examiner—David L. Talbott
Assistant Examiner—Alonzo Chambliss
(74) Attorney, Agent, or Firm—Renner, Otto, Boisselle & Sklar, LLP

(57) ABSTRACT

An integrated circuit structure includes a planar capacitor positioned adjacent to a logic circuit implemented on a silicon die. The silicon die is bonded to a mounting base using controlled collapse chip connection methods such that a ground terminal of the silicon die is coupled to a ground trace in the mounting base and a Vdd terminal of the silicon die is coupled to a Vdd trace in the mounting base. The capacitor includes via structures with controlled collapse chip connection structures for bonding to the mounting base directly above the silicon die and coupling a first charge accumulation plate to the Vdd trace and a second charge accumulation plate to the ground trace.

18 Claims, 2 Drawing Sheets

STACKED INTEGRATED CIRCUIT AND CAPACITOR STRUCTURE CONTAINING VIA STRUCTURES

TECHNICAL FIELD

The present invention relates to a semiconductor device, and more particularly to an integrated circuit structure and more particularly to a stacked combination of a semiconductor die and a flat capacitor.

BACKGROUND OF THE INVENTION

A logic circuit formed on a semiconductor die can be disrupted, or the circuit can even be permanently damaged, by electrostatic charge transients on connections to the circuit. The charge transients typically develop on the printed circuit board traces because such traces tend to function as antennas and pick up electromagnetic energy. The charge transient causes voltage spikes across capacitive junctions in the logic circuit in accordance with the formula Voltage Spike=Charge Transient/Capacitance The occurrence of such voltage spikes is independent of the fabrication technology and can disrupt or damage devices, such as field effect transistors (FETs) formed in bulk silicon wells, silicon on insulator SOI FETs formed on an SOI wafer, and other circuit elements fabricated utilizing known technologies.

While it is known that capacitors may be placed in close proximity to logic circuits on a printed circuit board to provide protection from charge transients as well as provide bypassing of high frequency noise, known capacitor structures occupy a significant amount of printed circuit board space. Furthermore, large capacitance capacitors are larger than small capacitance capacitors.

Accordingly, there is a strong need in the art for an integrated circuit structure that provides for a capacitor with a large capacitance to be located in close proximity to a semiconductor die without occupying significant area on a printed circuit board. Additionally, there is a strong need in the art for a electrostatic charge transient suppression structure which can provide enhanced protection from interruption and damage caused by charge transients in both conventional bulk silicon semiconductor circuits and in silicon on insulator semiconductor circuits.

SUMMARY OF THE INVENTION

A first object of the present invention is to provide an integrated circuit which includes: a) a logic circuit implemented on a silicon die including a first planar surface comprising a base substrate and a second planar surface comprising a plurality of connection terminals defining a connection plane; b) a planar capacitor with a top surface positioned adjacent to the first planar surface of the silicon die and including a first charge accumulation plate and a second charge accumulation plate separated by a dielectric; and c) a first via structure extending from the top surface of the capacitor to the connection plane and electrically coupling the first charge accumulation plate to a connection terminal in the connection plane. The second charge accumulation plate may be electrically coupled to the base substrate. Preferably, the plurality of connection terminals are controlled collapse chip connection terminals.

The integrated circuit may further include a second via structure extending from the top surface of the capacitor to the connection plane and electrically coupling the second charge accumulation plate to a connection terminal in the connection plane. Again, The second charge accumulation plate may be electrically coupled to the base substrate and the plurality of connection terminals may be controlled collapse chip connection terminals (C4).

A second object of the present invention is to provide a capacitor structure comprising: (a) a capacitor including a first planar charge accumulation plate and a second planar charge accumulation plate separated by a dielectric; (b) a first via support structure extending from a top surface of the capacitor to a connection plane and including a first controlled collapse chip connection (C4) terminal positioned in the connection plane and a via coupling the first planar charge accumulation plate to the first controlled collapse chip connection terminal (C4); and (c) a second via support structure spaced apart from the first via support chip and extending from the top surface of the capacitor to the connection plane and including a second controlled collapse chip connection (C4) terminal positioned in the connection plane and a via coupling the second planar charge accumulation plate to the second controlled collapse chip connection terminal (C4).

The capacitor structure may further include a logic circuit fabricated on a silicon die and positioned adjacent to the top surface of the capacitor between of the first via support structure and the second via support structure and including a plurality of logic circuit controlled collapse chip connection (C4) terminals positioned in the connection plane. Further yet the structure may include a ball grid array mounting base including a ground trace coupling to the silicon die and to the first via support structure and a Vdd trace coupling to the silicon die and to a second via support structure. Alternatively, the structure may include a printed circuit board mounting base including a ground trace coupling to the silicon die and to the first via support structure and a Vdd trace coupling to the silicon die and to a second via support structure.

A third object of the present invention is to provide a method of fabricating an integrated circuit structure, comprising: (a) fabricating a planar capacitor with a first charge accumulation plate and a second charge accumulate plate separated by a dielectric; (b) fabricating a first interconnect via extending from the capacitor to a connection plane and including a first conductive via for coupling the first charge accumulation plate to a terminal in the connection plane; (c) fabricating a second interconnect via extending from the capacitor to the connection plane and including a second conductive via for coupling the second charge accumulation plate to a terminal in the connection plane; (d) fabricating a semiconductor logic circuit on a silicon die with a bottom side adjacent to a top side of the capacitor and a top side extending to the connection plane; and (e) fabricating a plurality of connection terminals on the top surface of the semiconductor logic circuit.

Such method may further include fabricating an IC package including a plurality of vias, each corresponding to one of said connection terminals and simultaneously bonding the capacitor and the silicon die to the IC package to conductively couple the each of said connection terminals to one of said plurality of vias. Alternatively, such method may further include fabricating a printed circuit board including a plurality of vias, each corresponding to one of said connection terminals and simultaneously bonding the capacitor and the silicon die to the IC package to conductively couple the each of said connection terminals to one of said plurality of vias.

DESCRIPTION OF THE PREFERRED EMBODIMENTS

Figure 1:
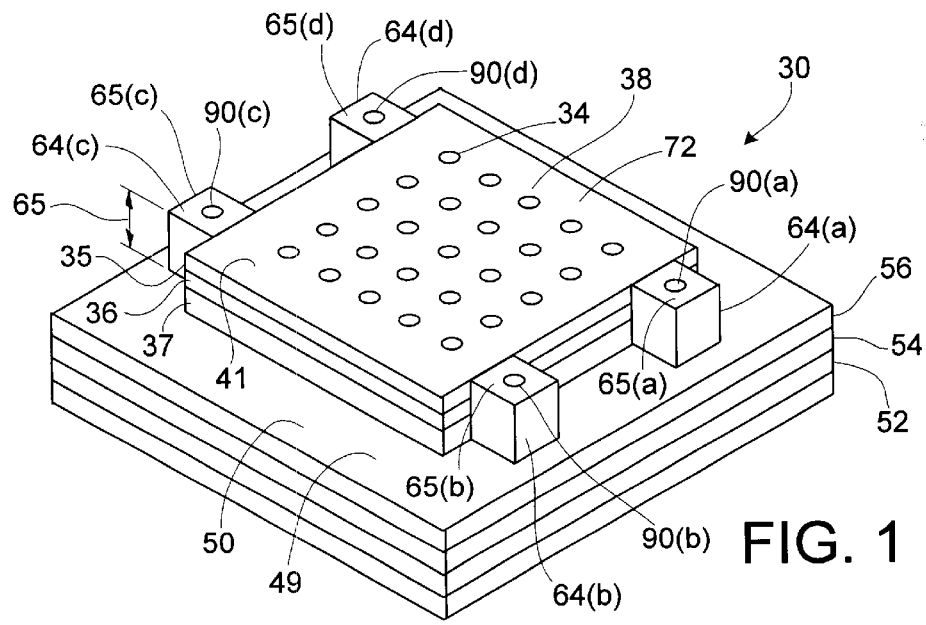
FIG. 1 is a perspective view of an integrated circuit structure in accordance with one embodiment of this invention.

The present invention will now be described in detail with reference to the drawings. In the drawings, like reference numerals are used to refer to like elements throughout.

Referring to FIG. 1, an integrated circuit structure 30 includes a flat capacitor 50 with a large capacitance, on the order of 0.35 ufarrads/cm$^2$ (assuming a 100 Anstrom thick silicon nitride dielectric) such that charge transients across capacitor 50 can be absorbed without causing large voltage spikes in accordance with the formula:

Voltage Spike=Charge Transient/Capacitance.

Capacitor 50 includes a first charge accumulation plate 52 separated from a second charge accumulation plate 56 by a dielectric layer 54. A silicon die 38 includes a semiconductor logic circuit formed thereon. In the exemplary embodiment, die 38 is a silicon on insulator die with a silicon device layer 35 on the top side separated from a base substrate 37 on the bottom side by an insulating buried oxide layer 39. However, die 38 may also be a bulk silicon die of a first semiconductor conductivity with silicon devices formed in wells of an opposite conductivity. The top surface 41 of die 38 includes a plurality of controlled collapse chip connection (C4) terminals 34 for coupling and bonding die 38 to a ceramic, plastic, or other integrated circuit package or directly to a printed circuit board (discussed later) using typical C4 coupling and bonding techniques. The plurality of C4 terminals 34 on the top surface 41 of die 38 to define a connection plane 72. A top surface 49 (e.g. second charge accumulation plate 56) of capacitor 50 is bonded to the base substrate 37 (e.g. bottom side) of die 38 using typical epoxy bonding techniques.

Capacitor 50 further includes a plurality of via structures 64(a)-64(d), each of which extends a height 65 above the top surface 49 of capacitor 50. Height 65 is equal to the thickness of die 38. As such, a C4 terminal 90(a)–(d) may be formed on the top surface 65(a)–(d) of each via structure 64(a)–(d) such that terminals 90(a)–(d) are located in connection plane 72.

Figure 2:
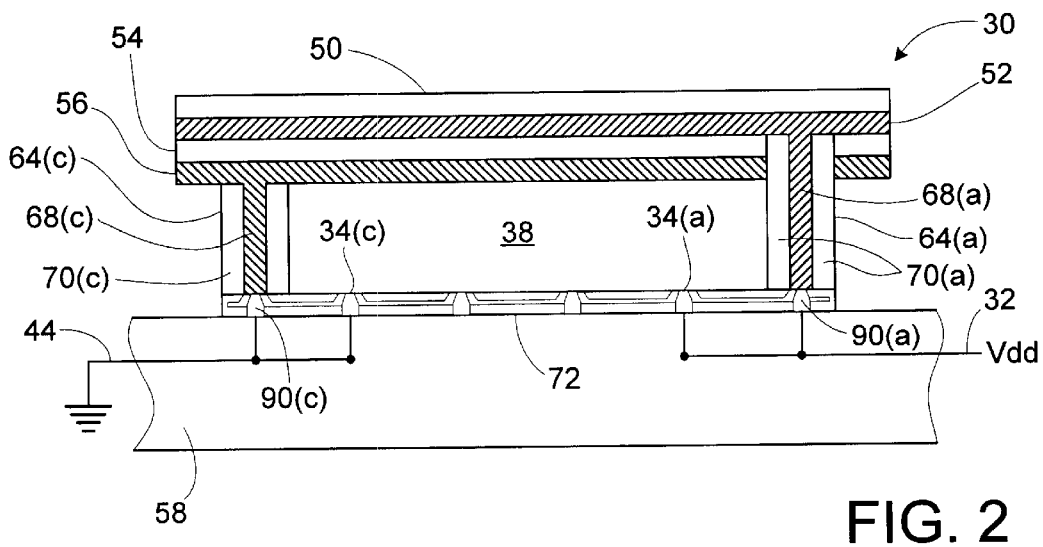
FIG. 2 is a cross sectional view of the integrated circuit structure of FIG. 1.

Referring to FIG. 2, the integrated circuit structure 30 of this invention is shown turned upside down from FIG. 1 and bonded to a mounting substrate 58 using known (C4) coupling and bonding techniques. In the preferred embodiment, the mounting base 58 is a printed circuit board, however, the mounting base 58 could also be any known ball grid array or pin type ceramic, plastic, or other IC package.

As shown, a Vdd trace 32, for example, in the mounting base 58 is coupled to a C4 terminal 90(a) on first via structure 64(a) and to C4 terminal 34(a) on die 38. A ground trace 44 in the mounting base 58 is coupled to C4 terminal 90(c) on a second via structure 64(c) and to a C4 terminal 34(c) on die 38. First via structure 64(a) includes a first conductive via 68(a) extending from the first charge accumulation plate 52 to C4 terminal 90(a) such that the Vdd trace 32 in mounting base 58 is electrically coupled to first charge accumulation plate 52 in capacitor 50. Second via structure 64(c) include a second conductive via 68(c) extending from the second charge accumulation plate 56 to C4 terminal 90(c) such that the ground trace 44 in mounting base 58 is electrically coupled to the second charge accumulation plate 56 in capacitor 50. A first insulating sheath 70(a) surrounds first via 68(a) and a second insulating sheath 70(c) surrounds second via 68(c).

It should be appreciated that this exemplary structure of coupling ground trace 44 to Vdd trace 32 across capacitor 50 enables capacitor 50 to absorb charge transients on either ground trace 44 or Vdd trace 32 to protect the logic circuit formed on die 38 from what would otherwise be disruptive or damaging charge transients. It should also be appreciated that capacitor 50 may be alternately coupled between any other traces in mounting base 58 as may be useful for dissipating charge transients or bypassing high frequency noise on such other traces.

In the preferred embodiment, second charge accumulation plate 56 is coupled to ground because it is adjacent to the base substrate 37 of silicon die 38 which is also typically coupled to ground. As such, no insulating layer is needed between second charge accumulation plate 56 and die 38.

Figure 3:
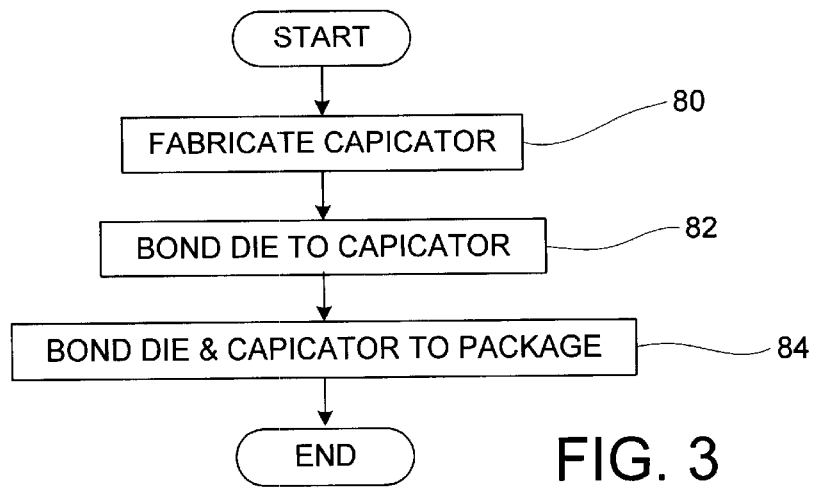
FIG. 3 is a flow chart showing an exemplary process for fabricating the integrated circuit structure of this invention.
Figure 4A:
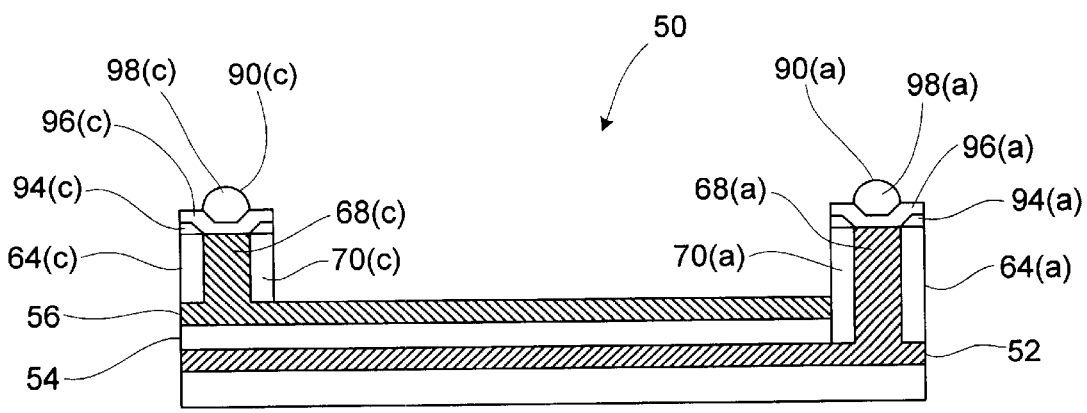
FIG. 4(a) is a cross sectional diagram of a first step in the exemplary process for fabricating the integrated circuit structure of FIG. 4.
Figure 4B:
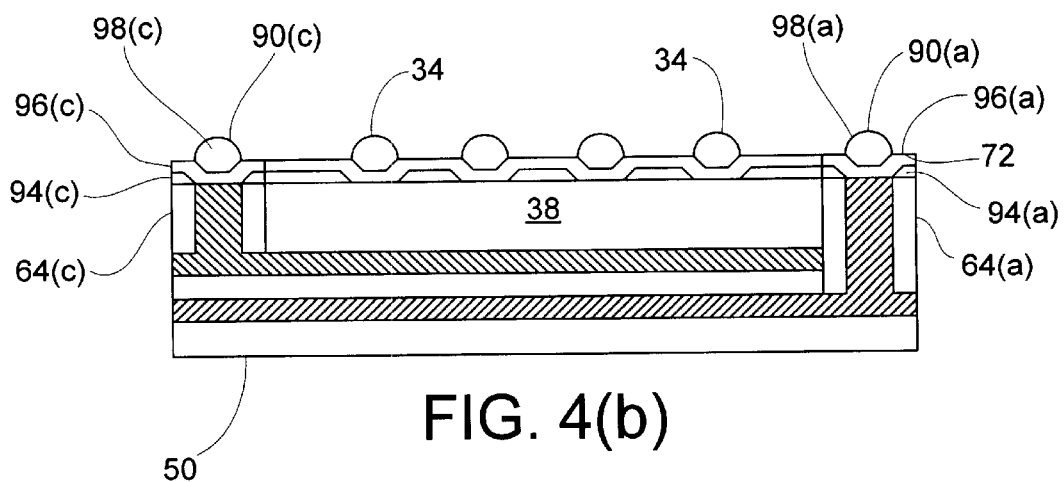
FIG. 4(b) is a cross sectional diagram of a second step in the exemplary process for fabricating the integrated circuit structure of FIG. 4.

Referring to the flowchart of FIG. 3 and the diagrams of FIGS. 4(a) and 4(b), an exemplary process for fabricating the integrated circuit structure of this invention is shown.

At step 80, the capacitor 50 is fabricated using known techniques as shown in FIG. 4(a). Known C4 processes are used for forming C4 terminals 90 on the top surfaces of the vias 64. The C4 terminals 90 will typically include a passivation layer 94(a), 94(c), a BLM layer 96(a), 96(c) and solder balls 98(a), 98(c) as is known in the art.

At step 82, the silicon die 38 is bonded to the capacitor 50 such that both the C4 connection surface of the silicon die 38 and the C4 connection surfaces of the first via structure 64 and the second via structure 66 are in the connection plane 72 as shown in FIG. 4(b). Known epoxy bonding techniques are used.

At step 84, the combination of the capacitor 50 and the silicon die 38 is turned over and aligned with, and bonded to, the mounting base 58 using known C4 coupling and bonding techniques as shown in FIG. 2.

The above described structure is useful for providing a capacitor with a large capacitance in close proximity to a logic circuit implemented on a silicon die without occupying significant area on a printed circuit board. Additionally, the capacitor structure is useful for suppressing transient charges formed on printed circuit board traces and/or bypassing high frequency noise. As such, the capacitor structure of this invention provides protection to logic circuits formed on silicon dies utilizing both bulk silicon technology and SOI technology.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. An integrated circuit comprising:
   a) a logic circuit implemented on a silicon die, wherein the silicon die includes a first planar surface defined by a base substrate of the silicon die, and wherein the silicon die includes a second planar surface defined by a plurality of first connection terminals in a connection plane;

b) a planar capacitor with a top surface positioned adjacent to the first planar surface of the silicon die, and including a first charge accumulation plate and a second charge accumulation plate separated by a dielectric layer; and c) a first via structure extending from the top surface of the capacitor to the connection plane, and electrically coupling the first charge accumulation plate to a second connection terminal and the second connection terminal, in the connection plane.

2. The integrated circuit of claim 1, wherein the second charge accumulation plate is electrically coupled to the base substrate.

3. The integrated circuit of claim 2, wherein the first connection terminals and the second connection terminal, are controlled collapse chip connection terminals.

4. The integrated circuit of claim 1, further including a second via structure extending from the top surface of the capacitor to the connection plane, wherein the second via structure electrically couples the second charge accumulation plate to a third connection terminal, in the connection plane.

5. The integrated circuit of claim 4, wherein the first via structure includes a first conductive via surrounded by a first insulating sheath, and wherein the second via structure includes a second via surrounded by a second insulating sheath.

6. The integrated circuit of claim 5 wherein the first insulating sheath is in contact with the silicon die, interposed between the first conductive via and the silicon die, and wherein the second insulating sheath is in contact with the silicon die interposed between the second conductive via and the silicon die.

7. The integrated circuit of claim 4, wherein the second charge accumulation plate is electrically coupled to the base substrate.

8. The integrated circuit of claim 7, wherein the first connection terminals are controlled collapse chip connection terminals.

9. The integrated circuit of claim 1, wherein the first charge accumulation plate is along the top surface of the capacitor.

10. A capacitor structure comprising:

(a) a capacitor including a first planar charge accumulation plate and a second planar charge accumulation plate separated by a dielectric layer;

(b) a first via support structure extending from a top surface of the capacitor to a connection plane, and including a first controlled collapse chip connection terminal positioned in the connection plane and a first via coupling the first planar charge accumulation plate to the first controlled collapse chip connection terminal; and (c) a second via support structure spaced apart from the first via support structure and extending from the top surface of the capacitor to the connection plane, and including a second controlled collapse chip connection terminal positioned in the connection plane and a second via coupling the second planar charge accumulation plate to the second controlled collapse chip connection terminal.

11. The capacitor structure of claim 10, further including a logic circuit fabricated on a silicon die and positioned adjacent to the top surface of the capacitor between of the first via support structure and the second via support structure and including a plurality of logic circuit controlled collapse chip connection terminals positioned in the connection plane.

12. The capacitor structure of claim 11, including a ball grid array mounting base including a ground trace coupling to the silicon die and to the first via support structure and a Vdd trace coupling to the silicon die and to a second via support structure.

13. The capacitor structure of claim 11, including printed circuit board mounting base including a ground trace coupling to the silicon die and to the first via support structure and a Vdd trace coupling to the silicon die and to a second via support structure.

14. The capacitor structure of claim 10, wherein the first planar charge accumulation plate is along the top surface of the capacitor.

15. The capacitor structure of claim 10, wherein the first via structure includes a first insulating sheath surrounding the first via, and wherein the second via structure includes a second insulating sheath surrounding the second via.

16. The capacitor structure of claim 15, wherein the first insulating sheath is in contact with the silicon die, interposed between the first via and the silicon die, and wherein the second insulating sheath is in contact with the silicon die interposed between the second via and the silicon die.

17. An integrated circuit comprising:

a silicon die having first and second planar surfaces on opposite sides of the silicon die;

a plurality of connection terminals in a connection plane, wherein the connection plane is defined by the first planar surface of the silicon die;

a capacitor in contact with the second planar surface of the silicon die, wherein the capacitor includes:

a first planar charge accumulation plate;

a second planar charge accumulation plate; and a dielectric layer between the planar charge accumulation plates; and a via support structure electrically coupling the planar charge accumulation plates to at least some of the terminals, wherein the via support structure includes:

a first conductive via electrically coupling the first planar charge accumulation plate to one of the terminals;

a first insulating sheath surrounding the first via, wherein the first insulating sheath is in contact with the silicon die, interposed between the first conductive via and the silicon die;

a second conductive via electrically coupling the second planar charge accumulation plate to another of the terminals; and a second conductive via surrounding the second via, wherein the second insulating sheath is in contact with the silicon die, interposed between the second conductive via and the silicon die.

18. The integrated circuit of claim 17, wherein the connection terminals include controlled collapse chip connection terminals.

* * * * *

UNITED STATES PATENT AND TRADEMARK OFFICE
CERTIFICATE OF CORRECTION

PATENT NO. : 6,452,250 B1 Page 1 of 1
DATED : September 17, 2002
INVENTOR(S) : Buynoski It is certified that error appears in the above-identified patent and that said Letters Patent is hereby corrected as shown below:

<u>Column 5,</u>
Lines 9-10, remove "and the second connection terminal"

Signed and Sealed this

Third Day of December, 2002

JAMES E. ROGAN
*Director of the United States Patent and Trademark Office*